(12) United States Patent
Tanaka et al.

(10) Patent No.: US 9,159,841 B2
(45) Date of Patent: Oct. 13, 2015

(54) METHOD FOR MANUFACTURING SEMICONDUCTOR DEVICE

(75) Inventors: Tetsuhiro Tanaka, Isehara (JP); Shinya Sasagawa, Chigasaki (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/466,480

(22) Filed: May 8, 2012

(65) Prior Publication Data

US 2012/0289005 A1      Nov. 15, 2012

(30) Foreign Application Priority Data

May 13, 2011  (JP) ................................ 2011-108761

(51) Int. Cl.
| | | |
|---|---|---|
| H01L 21/336 | (2006.01) | |
| H01L 29/786 | (2006.01) | |
| H01L 21/469 | (2006.01) | |
| H01L 21/306 | (2006.01) | |
| H01L 29/788 | (2006.01) | |
| H01L 29/66 | (2006.01) | |
| H01L 29/04 | (2006.01) | |
| H01L 21/02 | (2006.01) | |

(52) U.S. Cl.
CPC .... *H01L 29/78696* (2013.01); *H01L 21/02164* (2013.01); *H01L 21/02211* (2013.01); *H01L 21/02216* (2013.01); *H01L 21/02274* (2013.01); *H01L 29/04* (2013.01); *H01L 29/66765* (2013.01); *H01L 29/788* (2013.01); *H01L 29/78648* (2013.01); *H01L 29/78672* (2013.01)

(58) Field of Classification Search
CPC ................. H01L 29/78648; H01L 29/78672; H01L 21/02274; H01L 21/02164; H01L 29/78696; H01L 29/66765
USPC ......................................................... 438/158
See application file for complete search history.

(56) References Cited

U.S. PATENT DOCUMENTS

| | | | | |
|---|---|---|---|---|
| 4,409,134 A | | 10/1983 | Yamazaki | |
| 5,757,028 A | * | 5/1998 | Sasaki et al. | .................... 257/57 |

(Continued)

FOREIGN PATENT DOCUMENTS

| | | |
|---|---|---|
| JP | 2009-021571 A | 1/2009 |
| JP | 2011-192984 A | 9/2011 |

*Primary Examiner* — Colleen A Matthews
*Assistant Examiner* — Regan J Rundio
(74) *Attorney, Agent, or Firm* — Eric J. Robinson; Robinson Intellectual Property Law Office, P.C.

(57) ABSTRACT

A thin film transistor having low off-state current and excellent electrical characteristics can be manufactured. In an inverted staggered thin film transistor including a semiconductor film in which at least a microcrystalline semiconductor region and an amorphous semiconductor region are stacked, a conductive film and an etching protective film are stacked over the semiconductor film; a mask is formed over the etching protective film; first etching treatment in which the etching protective film, the conductive film, and the amorphous semiconductor region are partly etched is performed; then, the mask is removed. Next, second etching treatment in which the exposed amorphous semiconductor region and the microcrystalline semiconductor region are partly dry-etched is performed using the etched etching protective film as a mask so that the microcrystalline semiconductor region is partly exposed to form a back channel region.

29 Claims, 7 Drawing Sheets

(56) References Cited

U.S. PATENT DOCUMENTS

| | | | |
|---|---|---|---|
| 2003/0082918 A1* | 5/2003 | Hayasaka et al. | 438/706 |
| 2005/0153488 A1* | 7/2005 | Takemura | 438/153 |
| 2007/0087492 A1* | 4/2007 | Yamanaka | 438/166 |
| 2007/0172998 A1* | 7/2007 | Lee | 438/149 |
| 2007/0194312 A1* | 8/2007 | Chuman et al. | 257/59 |
| 2008/0308807 A1 | 12/2008 | Yamazaki et al. | |
| 2009/0059345 A1* | 3/2009 | Tung et al. | 359/290 |
| 2010/0035378 A1* | 2/2010 | Chang | 438/104 |
| 2010/0148177 A1* | 6/2010 | Koyama et al. | 257/59 |
| 2011/0012118 A1* | 1/2011 | Yamazaki et al. | 257/59 |
| 2011/0079777 A1* | 4/2011 | Akimoto | 257/43 |
| 2011/0084278 A1* | 4/2011 | Cho et al. | 257/59 |
| 2011/0121300 A1 | 5/2011 | Miyairi et al. | |
| 2011/0147754 A1 | 6/2011 | Isa et al. | |
| 2011/0204364 A1 | 8/2011 | Isa | |
| 2012/0086000 A1* | 4/2012 | Mizoguchi et al. | 257/43 |
| 2012/0094433 A1* | 4/2012 | Mizoguchi et al. | 438/104 |

\* cited by examiner

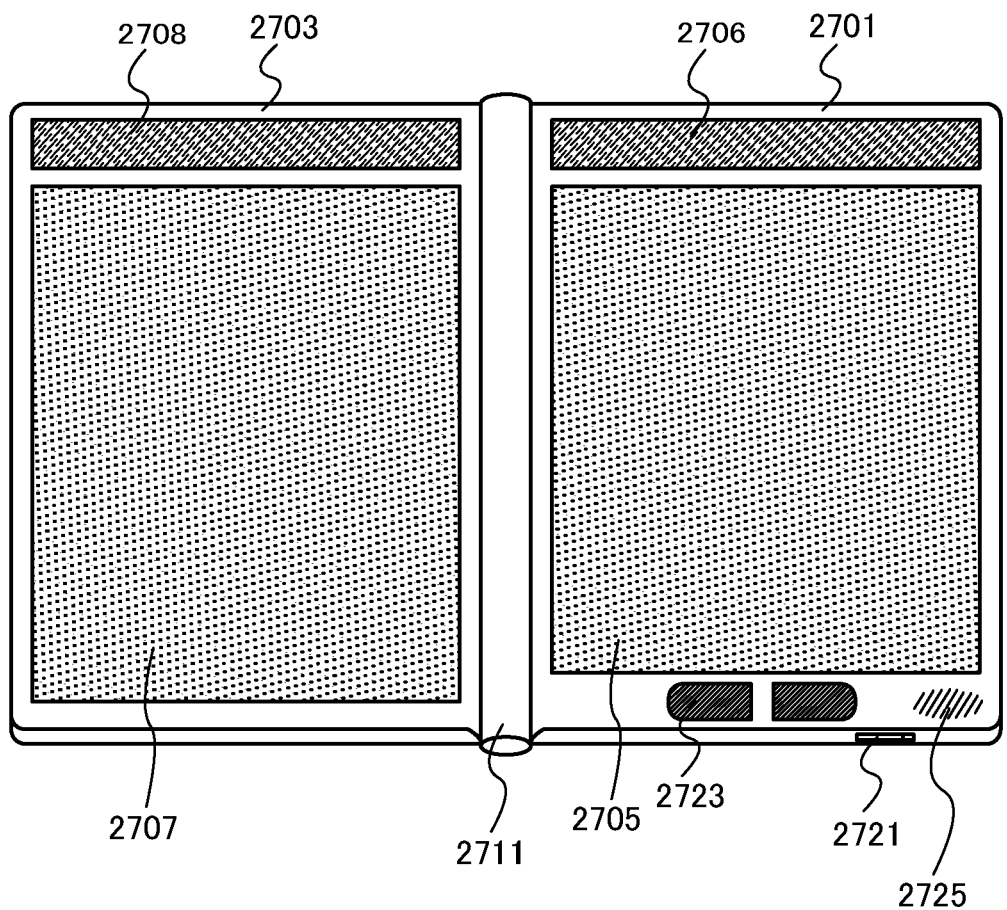

METHOD FOR MANUFACTURING SEMICONDUCTOR DEVICE

BACKGROUND OF THE INVENTION

1. Field of the Invention

The present invention relates to a method for manufacturing a semiconductor device and a display device.

In this specification, a semiconductor device means all types of devices which can function by utilizing semiconductor characteristics, and a display device, an electro-optical device, a photoelectric conversion device, a semiconductor circuit, and an electronic device are all semiconductor devices.

2. Description of the Related Art

As a type of field-effect transistor, a thin film transistor whose channel region is formed using a semiconductor film that is formed over a substrate having an insulating surface is known. There are techniques in which amorphous silicon, microcrystalline silicon, or polycrystalline silicon is used for the semiconductor film which is used for the channel region of the thin film transistor. A typical application of the thin film transistor is a liquid crystal television device, and the thin film transistor has been put to the practical use as a switching transistor in each pixel included in a display screen.

Further, a technique in which an inverted staggered thin film transistor is used as a switching transistor in a pixel in order to manufacture a large-size television device with high productivity is disclosed (see Patent Document 1). A thin film transistor with high on-state current is needed to manufacture a liquid crystal display device having high definition (a large number of pixels) (e.g., a full high-definition (FHD) liquid crystal display device, a liquid crystal display device with 4K2K resolution, or a liquid crystal display device with 8K4K resolution). Accordingly, a thin film transistor whose channel region is formed using a microcrystalline silicon film, which has higher on-state current than a thin film transistor whose channel region is formed using an amorphous semiconductor film, has attracted attention as a switching transistor in a pixel.

REFERENCE

[Patent Document 1] Japanese Published Patent Application No. 2009-21571

SUMMARY OF THE INVENTION

A thin film transistor whose channel region is formed using a microcrystalline silicon film, however, has a problem in that, though the field-effect mobility is improved, off-state current is high as compared to the thin film transistor whose channel region is formed using an amorphous silicon film and thus sufficient switching characteristics cannot be obtained.

Further, there is a problem in that in a semiconductor film to be a channel region of an inverted staggered thin film transistor, off-state current of the thin film transistor is increased depending on the state of a region which is on the side opposite to a surface on a gate electrode side (hereinafter referred to as a back channel region).

Thus, an object of one embodiment of the present invention is to manufacture a thin film transistor having low off-state current and excellent characteristics.

One embodiment of the present invention is a method for manufacturing a semiconductor device, which includes the following steps. In an inverted staggered thin film transistor including a semiconductor film in which at least a microcrystalline semiconductor region and an amorphous semiconductor region are stacked, a conductive film and an etching protective film are stacked over the semiconductor film; a mask is formed over the etching protective film; first etching treatment in which the etching protective film, the conductive film, and the amorphous semiconductor region are partly etched is performed; and then the mask is removed. Next, second etching treatment in which the exposed amorphous semiconductor region and the microcrystalline semiconductor region are partly dry-etched is performed using the etched etching protective film as a mask so that the microcrystalline semiconductor region is partly exposed to form a back channel region.

Further, one embodiment of the present invention is the method for manufacturing a semiconductor device, which further includes the following steps. After the second etching treatment, an insulating film is formed over the etched microcrystalline semiconductor region, amorphous semiconductor region, and etching protective film; then, over the insulating film, a back gate electrode overlapping with the etched microcrystalline semiconductor region, and a pixel electrode connected to wirings functioning as a source electrode and a drain electrode are formed.

Note that a region including a surface of the conductive film is formed using titanium, a titanium compound, or a titanium alloy. Thus, even in the case where the wiring functioning as a source electrode or a drain electrode is in contact with the pixel electrode, generation of electrolytic corrosion can be reduced, whereby contact resistance at a connection portion of the pixel electrode and the wiring can be reduced.

The etching protective film is formed using a metal oxide film formed of a hardly-etched material. Typical examples of the metal oxide film formed of a hardly-etched material include a film containing any of aluminum oxide, zirconium oxide, and hafnium oxide; a silicate film containing any of these materials ($HfSi_xO_y$, $ZrSi_xO_y$, or the like), and a film of a composite oxide containing two or more of these materials ($Hf_{1-x}Al_xO_y$, $Zr_{1-x}Al_xO_y$, or the like).

The first etching treatment is performed under a condition in which the etching protective film and the conductive film are etched. As a condition of the first etching treatment, chlorine or a chloride is used as an etching gas. Further, the second etching treatment is performed under a condition in which the exposed amorphous semiconductor region and the microcrystalline semiconductor region are more selectively etched than the etching protective film. As a condition of the second etching treatment, fluorine or a fluoride is used as an etching gas.

In the thin film transistor described according to one embodiment of the present invention, the amorphous semiconductor region is provided between the microcrystalline semiconductor region and an impurity semiconductor region. Thus, off-state current of the thin film transistor can be reduced. After the first etching treatment in which the conductive film and the etching protective film are etched using the mask so that the amorphous semiconductor region is exposed is performed, the mask is removed. Next, the second etching treatment in which the amorphous semiconductor region and the microcrystalline semiconductor region are selectively dry-etched partly is performed using the etched etching protective film as a mask so that the back channel region is formed. A residue on a surface of the amorphous semiconductor region, generated in the first etching treatment, is removed by the second etching treatment, so that a residue on a surface of the microcrystalline semiconductor region that is the back channel region can be reduced. Further, since the metal oxide film formed of a hardly-etched material over the conductive film functions as the etching protective film, a reduction in thickness of the conductive film due to the second etching treatment can be reduced. Accordingly, the thin film transistor having low off-state current can be manufactured. Further, electrolytic corrosion of the wiring and the pixel electrode can be reduced, whereby contact resistance at the connection portion of the wiring and the pixel electrode and can be reduced.

According to one embodiment of the present invention, a semiconductor device having low off-state current and excellent electrical characteristics can be manufactured. Further, the semiconductor device having excellent electrical characteristics can be manufactured with high productivity.

BRIEF DESCRIPTION OF THE DRAWINGS

FIG. 7 is a perspective view showing an example of an e-book reader.

DETAILED DESCRIPTION OF THE INVENTION

Figure 1A:
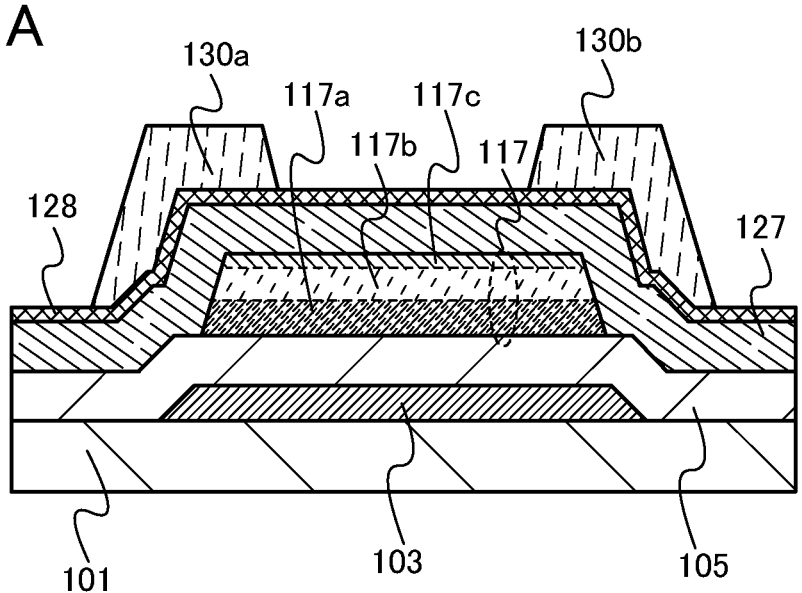
FIGS. 1A and 1B are cross-sectional views showing a method for manufacturing a semiconductor device according to one embodiment of the present invention.
Figure 1B:
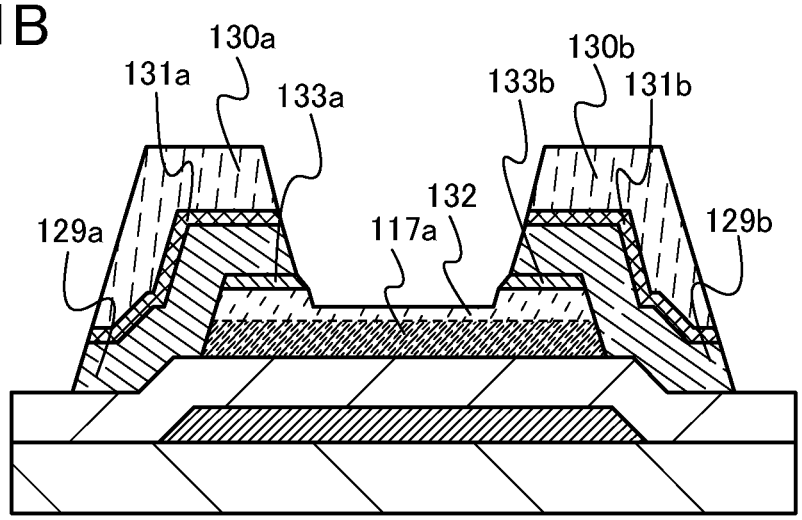

Hereinafter, embodiments of the present invention are described with reference to the drawings. However, the present invention is not limited to the following description. It is easily understood by those skilled in the art that the mode and detail can be variously changed unless departing from the scope and spirit of the present invention. Therefore, the present invention should not be interpreted as being limited to the description of the embodiments to be given below. Note that reference numerals denoting the same portions are commonly used in different drawings.

Embodiment 1

In this embodiment, a method for manufacturing a thin film transistor formed in a semiconductor device that is one embodiment of the present invention will be described with reference to FIGS. 1A and 1B, FIGS. 2A and 2C, and FIGS. 3A to 3D. Note that an n-channel thin film transistor has higher carrier mobility than a p-channel thin film transistor. Further, it is preferable that all thin film transistors formed over one substrate have the same polarity because the number of manufacturing steps can be reduced. Therefore, in this embodiment, a method for manufacturing an n-channel thin film transistor is described.

Note that the term "on-state current" refers to current which flows between a source electrode and a drain electrode when a thin film transistor is on. For example, in the case of an n-channel thin film transistor, on-state current refers to current which flows between a source electrode and a drain electrode when gate voltage is higher than the threshold voltage of the thin film transistor.

In addition, the term "off-state current" refers to current which flows between a source electrode and a drain electrode when a thin film transistor is off. For example, in the case of an n-channel thin film transistor, off-state current refers to current which flows between a source electrode and a drain electrode when gate voltage is lower than the threshold voltage of the thin film transistor.

As shown in FIG. 1A, a gate electrode 103 (also called a first gate electrode) is formed over a substrate 101. Next, a gate insulating film 105 which covers the gate electrode 103 is formed, and a semiconductor film 117 is formed over the gate insulating film 105. Note that in the semiconductor film 117, a microcrystalline semiconductor region 117a, an amorphous semiconductor region 117b, and an impurity semiconductor region 117c are stacked in this order. Next, a conductive film 127 is formed over the gate insulating film 105 and the semiconductor film 117. After that, an etching protective film 128 is formed over the conductive film 127. The conductive film 127 is selectively etched so that masks 130a and 130b for forming wirings which function as a source electrode and a drain electrode are formed.

As the substrate 101, a glass substrate; a ceramic substrate; a plastic substrate which has high heat resistance enough to withstand a process temperature of this manufacturing process; or the like can be used. In the case where the substrate does not need a light-transmitting property, a metal substrate such as a stainless steel substrate may be used. As the glass substrate, for example, an alkali-free glass substrate of barium borosilicate glass, aluminoborosilicate glass, aluminosilicate glass, or the like may be used. Note that there is no limitation on the size of the substrate 101. For example, any of glass substrates of the 3rd to 10th generations which are often used in the field of flat panel displays can be used.

The gate electrode 103 can be formed as a single layer or a stacked layer using a metal material such as molybdenum, titanium, chromium, tantalum, tungsten, aluminum, copper, neodymium, scandium, or nickel or an alloy material which includes any of these materials as a main component. A semiconductor typified by polycrystalline silicon doped with an impurity element such as phosphorus, an Ag—Pd—Cu alloy, an Al—Nd alloy, an Al—Ni alloy, or the like may be used.

For example, the following is preferable as a two-layer structure of the gate electrode 103: a two-layer structure in which a molybdenum film is stacked over an aluminum film, a two-layer structure in which a molybdenum film is stacked over a copper film, a two-layer structure in which a titanium nitride film or a tantalum nitride film is stacked over a copper film, a two-layer structure in which a titanium nitride film and a molybdenum film are stacked, a two-layer structure in which a film of a copper-magnesium alloy containing oxygen and a copper film are stacked, a two-layer structure in which a film of copper-manganese alloy containing oxygen and a copper film are stacked, a two-layer structure in which a copper-manganese alloy film and a copper film are stacked, or the like. As a three-layer structure, it is preferable to stack a tungsten film or a tungsten nitride film, an alloy film of aluminum and silicon or an alloy film of aluminum and titanium, and a titanium nitride film or a titanium film. By stacking a metal film functioning as a barrier film over a film having low electric resistance, electric resistance can be low and diffusion of a metal element from the metal film into the semiconductor film can be prevented.

The gate electrode 103 can be formed in the following manner: a conductive film is formed over the substrate 101 by a CVD method, a sputtering method or a vacuum evaporation method using the above-described material(s); a mask is formed over the conductive film by a photolithography method, an inkjet method, or the like; and the conductive film is etched using the mask. Alternatively, the gate electrode 103 can be formed by discharging a conductive nanopaste of silver, gold, copper, or the like over the substrate by an inkjet method and baking the conductive nanopaste. In order to improve adhesion between the gate electrode 103 and the substrate 101, a film of a nitride of any of the above-described metal materials may be provided between the substrate 101 and the gate electrode 103. In this embodiment, the gate electrode 103 is formed in the following manner: a conductive film is formed over the substrate 101 and etched using a mask formed by a photolithography method.

Note that side surfaces of the gate electrode 103 are preferably tapered. For example, the angle between the substrate 101 and the side surface of the gate electrode 103 is preferably 20° to 60° inclusive, more preferably 35° to 45° inclusive. This is because an insulating film, a semiconductor film, and a wiring which are formed over the gate electrode 103 in later steps can be prevented from being cut at a step portion of the gate electrode 103. In order to taper the side surfaces of the gate electrode 103, etching may be performed while the mask is made to recede.

In the step of forming the gate electrode 103, a gate wiring (a scan line) and a capacitor wiring can also be formed at the same time. Note that a "scanning line" means a wiring which selects a pixel, while a "capacitor wiring" means a wiring which is connected to one of electrodes of a storage capacitor in a pixel. However, without limitation thereto, the gate electrode 103 and either or both a gate wiring and a capacitor wiring may be formed separately.

The gate insulating film 105 (also referred to as a first gate insulating film) can be formed as a single layer or a stacked layer using a silicon oxide film, a silicon oxynitride film, a silicon nitride film, a silicon nitride oxide film, an aluminum oxide film, an aluminum nitride film, an aluminum oxynitride film, or an aluminum nitride oxide film.

Note that here, silicon oxynitride contains more oxygen than nitrogen, and preferably contains, when measured using Rutherford backscattering spectrometry (RBS) and hydrogen forward scattering (HFS), oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, silicon nitride oxide contains more nitrogen than oxygen, and preferably contains, when measured using RBS and HFS, oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride or the silicon nitride oxide is defined as 100 at. %.

By the formation of the gate insulating film 105 using an oxide insulating film such as silicon oxide or silicon oxynitride, fluctuation in the threshold voltage of the thin film transistor can be suppressed.

The gate insulating film 105 can be formed by a CVD method, a sputtering method, or the like. In a step of forming the gate insulating film 105 by a CVD method, glow discharge plasma is generated by applying high-frequency power in the HF band ranging from 3 MHz to 30 MHz, typically 13.56 MHz to 27.12 MHz, or high-frequency power in the VHF band ranging from 30 MHz to about 300 MHz, typically 60 MHz. Alternatively, glow discharge plasma is generated by applying high-frequency power at a microwave frequency of 1 GHz or more. Note that a pulsed oscillation by which high-frequency power is applied in a pulsed manner or a continuous oscillation by which high-frequency power is applied continuously may be applied. In addition, by superimposing high-frequency power in the HF band and high-frequency power in the VHF band on each other, unevenness of plasma across a large-sized substrate is reduced, so that uniformity in film thickness and film quality can be increased and the deposition rate can be increased. When the gate insulating film 105 is formed at a high frequency (1 GHz or more) using a microwave plasma CVD apparatus, the withstand voltage between the gate electrode and the drain and source electrodes can be improved, so that a highly reliable thin film transistor can be obtained.

Further, by the formation of a silicon oxide film by a CVD method using an organosilane gas as the gate insulating film 105, the crystallinity of a microcrystalline semiconductor region in the semiconductor film to be formed later can be increased, whereby the on-state current and the field-effect mobility of the thin film transistor can be increased. As an organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$) can be used.

The microcrystalline semiconductor region 117a, the amorphous semiconductor region 117b, and the impurity semiconductor region 117c in the semiconductor film 117 are formed in the following manner: a microcrystalline semiconductor film, an amorphous semiconductor film, and an impurity semiconductor film are stacked in this order; a mask is formed over the impurity semiconductor film; and etching is selectively performed using the mask.

The microcrystalline semiconductor film which is to be the microcrystalline semiconductor region 117a by being etched is formed by glow discharge plasma with the use of a mixture of hydrogen and a deposition gas containing silicon or germanium as a source gas. Alternatively, the microcrystalline semiconductor film is formed by glow discharge plasma with the use of a mixture of the source gas and a rare gas such as helium, argon, neon, krypton, or xenon. Here, a microcrystalline silicon film, a microcrystalline silicon germanium film, a microcrystalline germanium film, or the like is formed as the microcrystalline semiconductor film under the conditions that the deposition gas is diluted so that the flow rate of hydrogen is 50 times or more and 6000 times or less, preferably 50 times or more and 3000 times or less that of the deposition gas containing silicon or germanium, and the pressure in a process chamber is higher than or equal to 67 Pa and lower than or equal to 50000 Pa (higher than or equal to 0.5 Torr and lower than or equal to 370 Torr), preferably higher than or equal to 67 Pa and lower than or equal to 13332 Pa (higher than or equal to 0.5 Torr and lower than or equal to 100 Torr).

The deposition temperature at this time is preferably room temperature to 350° C., further preferably 150° C. to 280° C. Note that a gap between an upper electrode and a lower electrode may be a gap which allows generation of plasma. Note that the flow rate of hydrogen to the deposition gas containing silicon or germanium means the flow rate of hydrogen to the 100% undiluted deposition gas containing silicon or germanium. Thus, in the case where the deposition gas containing silicon or germanium is diluted, the flow rate of the 100% deposition gas containing silicon or germanium in the diluted gas is calculated and then the flow rate of hydrogen is adjusted based on the flow rate of the 100% deposition gas.

The microcrystalline semiconductor film is formed of a microcrystalline semiconductor. Note that a microcrystalline semiconductor is a semiconductor having an intermediate structure between amorphous and crystalline structures (including single crystal and polycrystal). Thus, the microcrystalline semiconductor includes an amorphous semiconductor region. A microcrystalline semiconductor is a semiconductor having a third state that is stable in terms of free energy and a crystalline semiconductor having short-range order and lattice distortion, in which columnar or needle-like mixed phase grains having a size of 2 nm to 200 nm, preferably 10 nm to 80 nm, more preferably 20 nm to 50 nm have grown in a direction normal to the substrate surface. Therefore, there is a case in which a crystal grain boundary is formed at the interface between the columnar or needle-like mixed phase grains. Note that the diameter of the grain here means a maximum diameter of a crystal grain in a plane parallel to the substrate surface. The mixed phase grain includes an amorphous semiconductor region and a crystallite which is a minute crystal which can be regarded as a single crystal.

Microcrystalline silicon which is a typical example of the microcrystalline semiconductor has a peak of Raman spectrum which is shifted to a lower wave number than 520 $cm^{-1}$ that represents single crystal silicon. That is, the peak of the Raman spectrum of the microcrystalline silicon exists between 520 $cm^{-1}$ which represents single crystal silicon and 480 $cm^{-1}$ which represents amorphous silicon. The microcrystalline semiconductor includes at least 1 at. % or more of hydrogen or halogen to terminate a dangling bond. Moreover, microcrystalline silicon is made to contain a rare gas element such as helium, argon, neon, krypton, or xenon to further enhance lattice distortion, whereby stability is improved and a favorable microcrystalline semiconductor can be obtained. Such a microcrystalline semiconductor is disclosed in, for example, U.S. Pat. No. 4,409,134.

The amorphous semiconductor film which is to be the amorphous semiconductor region 117b by being etched is formed by glow discharge plasma using a deposition gas containing silicon or germanium. Alternatively, the amorphous semiconductor film is formed by glow discharge plasma using a mixture of hydrogen and a deposition gas containing silicon or germanium. Here, an amorphous silicon film, an amorphous silicon germanium film, an amorphous germanium film, or the like is formed as the amorphous semiconductor film under the conditions that the deposition gas is diluted so that the flow rate of hydrogen is 0.1 times or more and 10 times or less that of the deposition gas containing silicon or germanium, and the pressure in a process chamber is higher than or equal to 67 Pa and lower than or equal to 50000 Pa (higher than or equal to 0.5 Torr and lower than or equal to 370 Torr), preferably higher than or equal to 67 Pa and lower than or equal to 13332 Pa (higher than or equal to 0.5 Torr and lower than or equal to 100 Torr).

The deposition temperature at this time is preferably room temperature to 350° C., further preferably 150° C. to 280° C. Note that a gap between the upper electrode and the lower electrode may be a gap which allows generation of plasma.

The impurity semiconductor film which is to be the impurity semiconductor region 117c by being etched is formed by glow discharge plasma with the use of a mixture of a deposition gas containing silicon, hydrogen, and phosphine (diluted with hydrogen or silane) in a process chamber of the plasma CVD apparatus so that amorphous silicon to which phosphorus is added or microcrystalline silicon to which phosphorus is added is formed. In the case of forming a p-type thin film transistor, the impurity semiconductor film 113 may be formed by glow discharge plasma using diborane instead of phosphine.

Typical examples of the deposition gas containing silicon or germanium include $SiH_4$, $Si_2H_6$, $GeH_4$, and $Ge_2H_6$.

When the microcrystalline semiconductor film, the amorphous semiconductor film, and the impurity semiconductor film are formed, glow discharge plasma is generated by application of high-frequency power which is cited in the formation of the gate insulating film 105 as appropriate.

The conductive film 127 is formed by a stack of a first conductive layer formed using aluminum, copper, neodymium, scandium, molybdenum, chromium, tantalum, tungsten, or the like, and a second conductive layer formed using titanium, a titanium compound, a titanium alloy, or the like. Examples of the titanium compound include titanium nitride and titanium oxide. Alternatively, the conductive film 127 may have a stacked structure in which the first conductive layer is provided between conductive layers formed using titanium, a titanium compound, a titanium alloy, or the like.

The conductive film 127 to be wiring connected to a pixel electrode later is formed to have a stacked structure of at least the first conductive layer and the second conductive layer, and an upper layer of the conductive film 127, that is a region on the upper surface side of the conductive film 127 is to be the second conductive layer formed using titanium, a titanium compound, a titanium alloy, or the like. Thus, the pixel electrode is prevented from being in contact with the first conductive layer at a connection portion of the wiring and the pixel electrode. In particular, when aluminum is used for the first conductive layer and ITO is used for the pixel electrode, electrolytic corrosion between the ITO and aluminum can be prevented. As a result, electrolytic corrosion of the wiring and the pixel electrode, and an increase in contact resistance due to dissolution or the like can be prevented.

The conductive film 127 is formed by a CVD method, a sputtering method, or a vacuum evaporation method.

The etching protective film 128 is formed using a metal oxide film formed of a hardly-etched material. Typical examples of the metal oxide film formed of a hardly-etched material is aluminum oxide, zirconium oxide, hafnium oxide, silicate containing any of these materials ($HfSi_xO_y$, $ZrSi_xO_y$, or the like), and a composite oxide containing two or more of these materials ($Hf_{1-x}Al_xO_y$, $Zr_{1-x}Al_xO_y$, or the like). The etching protective film 128 is preferably formed with a thickness of greater than or equal to 5 nm and less than or equal to 20 nm, because in that case the etching protective film 128 can be easily etched in the etching for the etching protective film 128 and the conductive film 127 to be performed later.

The etching protective film 128 is formed by a CVD method or a sputtering method. An aluminum oxide film that is an example of the etching protective film 128 is formed under the following condition, for example, aluminum oxide is used as a target, argon with a flow rate of 25 sccm and oxygen with a flow rate of 25 sccm are used as sputtering gases, the pressure is 0.4 Pa, the power of the power source is 15 kw, the distance between the substrate and the target is 60 mm, and the substrate temperature is 250° C.

The masks 130a and 130b are formed by a photolithography step. Alternatively, the masks 130a and 130b may be formed by a screen printing method, an inkjet method, or the like.

Next, the conductive film 127 and the etching protective film 128 are etched with the use of the masks 130a and 130b, so that wirings 129a and 129b functioning as a source electrode and a drain electrode, and etching protective films 131a and 131b are formed. Next, part of the semiconductor film 117 is etched, so that a pair of impurity semiconductor regions 133a and 133b functioning as a source region and a drain region, and an amorphous semiconductor region 132 having a depressed portion are formed. In the etching of the semiconductor film 117, the semiconductor film 117 needs to be etched so as not to expose the microcrystalline semiconductor region 117a, and at least the impurity semiconductor region 117c is etched. Alternatively, the impurity semiconductor region 117c and part of the amorphous semiconductor region 117b are etched (see FIG. 1B). Note that the etching protective films 131a and 131b function as etching protective films of the wirings 129a and 129b in the etching to be performed later.

The etching of the conductive film 127 and the etching protective film 128 may be either dry etching or wet etching. The etching condition can be employed as appropriate such that the conductive film 127 and the etching protective film 128 are etched. There is no particular limitation on a dry etching method, and an inductively coupled plasma (ICP) method, a capacitively coupled plasma (CCP) method, an electron cyclotron resonance (ECR) method, a reactive ion etching (RIE) method, or the like can be used. As an example of the dry etching condition, chlorine ($Cl_2$) or a chloride, the etching rate of which is fast, is used as an etching gas. An example of the chloride is $BCl_3$. In addition, a mixed gas containing one or both of chlorine and $BCl_3$ (e.g., a mixed gas of $BCl_3$ and $O_2$, a mixed gas of $BCl_3$ and $Cl_2$, a mixed gas of $BCl_3$, $Cl_2$, and $O_2$, a mixed gas of $BCl_3$ and $C_4F_8$, a mixed gas of $Cl_2$ and a rare gas, a mixed gas of $Cl_2$ and $O_2$, a mixed gas of $Cl_2$ and $CF_4$, a mixed gas of $Cl_2$, $CF_4$, and $O_2$, a mixed gas of $Cl_2$ and HBr, or a mixed gas of $Cl_2$, HBr, and $O_2$) can be given. Note that when $BCl_3$ is used for the etching gas, boron and chlorine which have dissociated in plasma react with oxygen in a metal oxide and become a boron-oxygen-chlorine compound. As a result, oxygen contained in the metal oxide can be removed. Further, chlorine and a metal element react with each other to be a chloride. Consequently, the metal element contained in the metal oxide is removed, so that the etching proceeds. Thus, the metal oxide that is a hardly-etched material can be etched more easily. An example of the wet etching condition includes a condition in which hydrofluoric acid or a mixture of hydrofluoric acid and nitric acid is used for an etchant.

Note that one of the wirings 129a and 129b functions as a signal line as well as a source electrode or a drain electrode. However, without limitation thereto, a signal line may be provided separately from the source and drain electrodes.

Figure 2A:
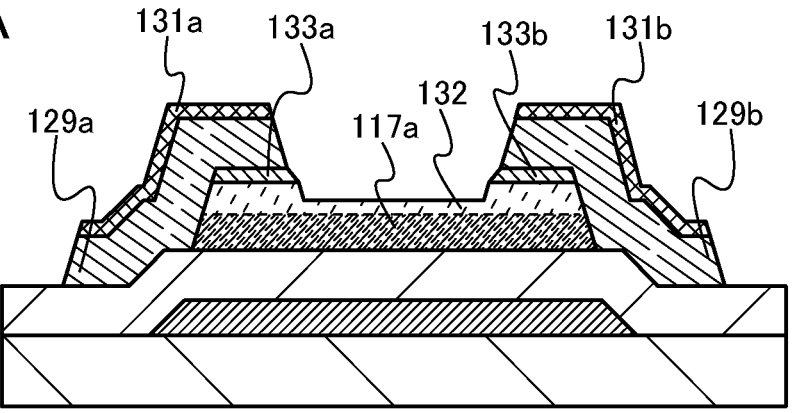
FIGS. 2A to 2C are cross-sectional views showing the method for manufacturing a semiconductor device according to one embodiment of the present invention.

Next, as shown in FIG. 2A, the masks 130a and 130b are removed. There is a case where part of a solution used for removing the masks in this step remains on the surface of the amorphous semiconductor region 132. The part of the solution used for removing the masks, which remains on the surface of the amorphous semiconductor region 132 is hereinafter referred to as a residue.

Figure 2B:
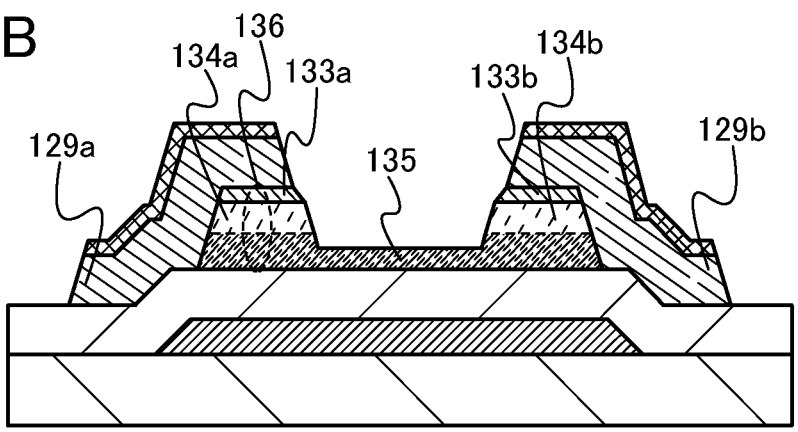
Figure 2C:
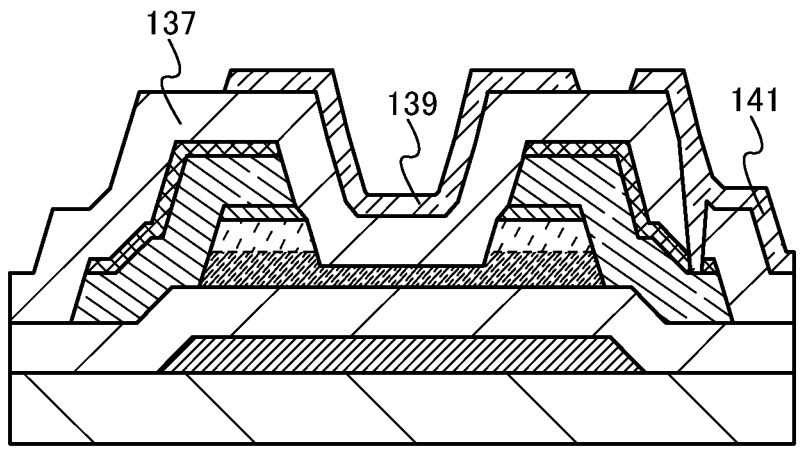

Next, the amorphous semiconductor region 132 and part of the microcrystalline semiconductor region 117a are etched using the wirings 129a and 129b and the etching protective films 131a and 131b as masks, so that a divided pair of amorphous semiconductor regions 134a and 134b, and a microcrystalline semiconductor region 135 having a depressed portion are formed as shown in FIG. 2B. That is, a semiconductor film 136 including the microcrystalline semiconductor region 135, the pair of amorphous semiconductor regions 134a and 134b, and the pair of impurity semiconductor regions 133a and 133b is formed.

The amorphous semiconductor region 132 and the microcrystalline semiconductor region 117a can be etched by dry etching. By the dry etching, the amorphous semiconductor region 132 and the microcrystalline semiconductor region 117a can be more selectively etched than the etching protective film. There is no particular limitation on the dry etching method, and an ICP method, a CCP method, an ECR method, a RIE method, or the like can be employed as appropriate. As the etching condition, the condition in which the amorphous semiconductor region 132 and the microcrystalline semiconductor region 117a are more selectively etched than the etching protective film and the wirings is used as appropriate. As an example of the etching condition, a condition in which fluorine or a fluoride is used as an etching gas is given. As the fluoride, $NF_3$, $CF_4$, $CHF_3$, or a mixed gas containing one or more of the fluoride (a mixed gas of HBr and $NF_3$, a mixed gas of $CF_4$ and $O_2$, or the like) can be given. The amorphous semiconductor region 132 and the microcrystalline semiconductor region 117a can be etched, for example, under the following conditions: $BCl_3$ with a flow rate of 60 sccm and $Cl_2$ with a flow rate of 20 sccm are used as etching gases; the pressure is 1.9 Pa; the ICP power is 450 W; and the bias power is 100 W.

By the etching treatment, in the semiconductor film 136, the microcrystalline semiconductor region 135, the amorphous semiconductor regions 134a and 134b, and the impurity semiconductor regions 133a and 133b are stacked in regions covered with the wirings 129a and 129b, and the microcrystalline semiconductor region 135 is exposed in a region which is not covered with the wirings 129a and 129b and overlaps with at least the gate electrode 103. Further, the residue on the surface of the amorphous semiconductor region 132 can be removed.

As described in the above steps, the etching includes two stages; the etching at the first stage is performed so as not to expose the microcrystalline semiconductor region 117a and then the masks are removed. In the step of removing the masks, the microcrystalline semiconductor region 117a is not in contact with the residue because of being covered with the amorphous semiconductor region 132. After the masks are removed, the etching of the amorphous semiconductor region 132 with the use of the etching protective films 131a and 131b as masks is performed as the etching at the second stage, so that the microcrystalline semiconductor region 135 is formed. Thus, the residue does not remain in a back channel.

As an example of the etching condition for the microcrystalline semiconductor region and the amorphous semiconductor region, fluorine or a fluoride is used for an etching gas. In a conventional structure where the etching protective film is not provided, when the microcrystalline semiconductor region and the amorphous semiconductor region are etched with the masks removed and with the wirings 129a and 129b exposed, regions each containing titanium, a titanium compound, or a titanium alloy, which are provided over the surfaces of the wirings 129a and 129b react with fluorine or the fluoride, whereby the regions containing titanium, the titanium compound, or the titanium alloy are etched. When the reactant of titanium, the titanium compound, or the titanium alloy, and fluorine or the fluoride remains in the back channel, current flows through the reactant, which causes an increase in the off-state current of a thin film transistor. However, in this embodiment, the metal oxide film formed of a hardly-etched material, which functions as the etching protective film, is formed over the wirings; thus, titanium, the titanium compound, or the titanium alloy which is provided over upper layers of the wirings does not react with fluorine or the fluoride, and is not etched in the etching at the second stage.

Accordingly, since the microcrystalline semiconductor region 135 serves as a channel region of the thin film transistor, which is to be formed later on a back gate side, leakage current due to the residue remaining in the back channel is not generated by removal of the residue in the region. Consequently, the off-state current of the thin film transistor can be further reduced. Further, the conductive layer formed of titanium, a titanium compound, or a titanium alloy is in contact with the pixel electrode at the connection portion of the pixel electrode which is to be formed later and the wiring; thus, electrolytic corrosion of the pixel electrode can be reduced, and an increase in contact resistance of the wiring and the pixel electrode can be prevented.

Next, the surfaces of the microcrystalline semiconductor region 135 and the amorphous semiconductor regions 134a and 134b may be subjected to plasma treatment typified by water plasma treatment, oxygen plasma treatment, ammonia plasma treatment, nitrogen plasma treatment, plasma treatment using a mixed gas of oxygen and hydrogen, or the like.

Further, after the dry etching, water plasma treatment is successively performed, whereby even if a residue is generated in the etching at the second stage, it can be removed, and defects in the microcrystalline semiconductor region 135 can be reduced. Moreover, by the plasma treatment, a higher insulating property between the source region and the drain region can be obtained, and thus, the off-state current of the completed thin film transistor can be reduced, and variation in electric characteristics can be reduced.

Through the above-described steps, a single-gate thin film transistor can be manufactured. With the structure described in this embodiment, a single-gate thin film transistor having low off-state current, high on-state current, and high field-effect mobility can be manufactured with high productivity.

Next, an insulating film 137 (also referred to as a second gate insulating film) is formed over the semiconductor film 136. The insulating film 137 can be formed in a manner similar to that for the gate insulating film 105.

Then, an opening (not illustrated) is formed in the insulating film 137 with the use of a mask formed by a photolithography step. Then, a back gate electrode 139 (also referred to as a second gate electrode) and a pixel electrode 141 are formed over the insulating film 137 (see FIG. 2C). Through the above-described process, a dual-gate thin film transistor can be manufactured.

The back gate electrode 139 and the pixel electrode 141 can be formed using a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added.

Alternatively, the back gate electrode 139 and the pixel electrode 141 can be formed using a conductive composition containing a light-transmitting conductive high molecule (also referred to as a light-transmitting conductive polymer). The back gate electrode 139 preferably has sheet resistance of 10000 Ω/sq. or less and a light transmittance of 70% or greater at a wavelength of 550 nm. Further, the resistivity of the conductive high molecule included in the conductive composition is preferably less than or equal to 0.1 Ω·cm.

As the conductive macromolecule, a so-called t-electron conjugated conductive high molecule can be used. For example, polyaniline and a derivative thereof, polypyrrole and a derivative thereof, polythiophene and a derivative thereof, and a copolymer of two or more of aniline, pyrrole, and thiophene and a derivative thereof can be given.

The back gate electrode 139 and the pixel electrode 141 can be formed by forming a thin film formed using any of the above materials by a CVD method, a sputtering method, or a vacuum evaporation method, and then etching the thin film using a mask formed by a photolithography step. Alternatively, the back gate electrode 139 and the pixel electrode 141 may be formed by discharging a conductive nanopaste of silver, gold, copper, or the like by a screen printing method, an inkjet method, or the like and baking the conductive nanopaste.

Next, a form of the back gate electrode is described with reference to FIGS. 3A to 3D that are top views of the thin film transistors.

Figure 3A:
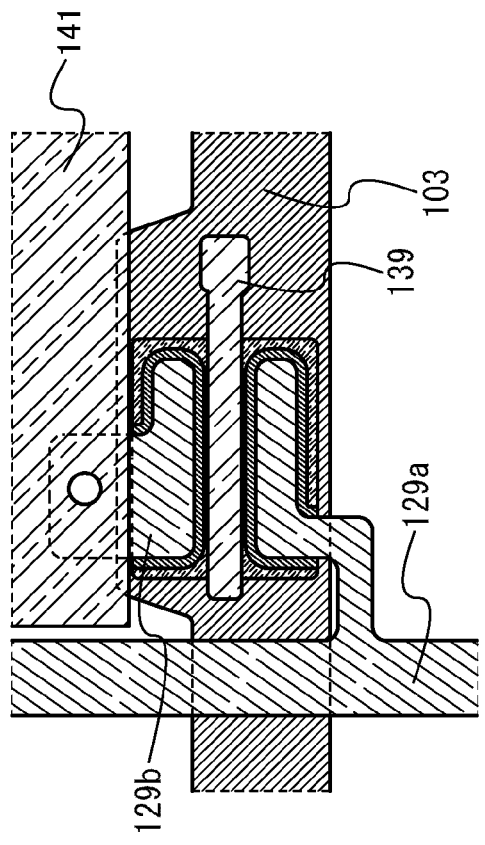
FIGS. 3A to 3D are top views each showing a method for manufacturing a semiconductor device according to one embodiment of the present invention.

As shown in FIG. 3A, the back gate electrode 139 can be formed in parallel to the gate electrode 103. In this case, each of potential applied to the back gate electrode 139 and potential applied to the gate electrode 103 can be controlled independently. Thus, the threshold voltage of the thin film transistor can be controlled. Further, regions in which carriers flow, that is, channel regions are formed on the gate insulating film 105 side and on the insulating film 137 side in the microcrystalline semiconductor region; thus, the on-state current of the thin film transistor can be increased.

Figure 3B:
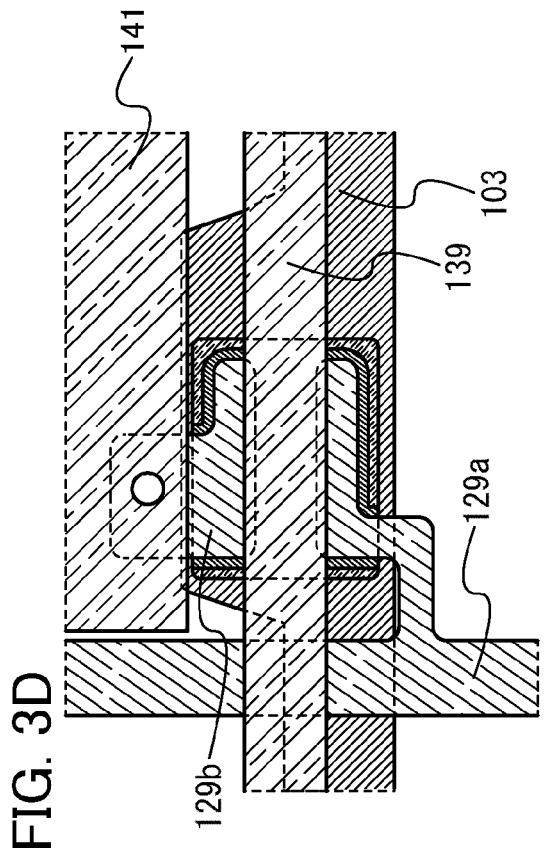

As shown in FIG. 3B, the back gate electrode 139 can be connected to the gate electrode 103. That is, the gate electrode 103 and the back gate electrode 139 can be connected through an opening 150 formed in the gate insulating film 105 and the insulating film 137. In this case, potential applied to the back gate electrode 139 and potential applied to the gate electrode 103 are equivalent. As a result, regions in which carriers flow in a semiconductor film, that is, channel regions are formed on the gate insulating film 105 side and on the insulating film 137 side in the microcrystalline semiconductor region; thus, the on-state current of the thin film transistor can be increased.

Figure 3C:
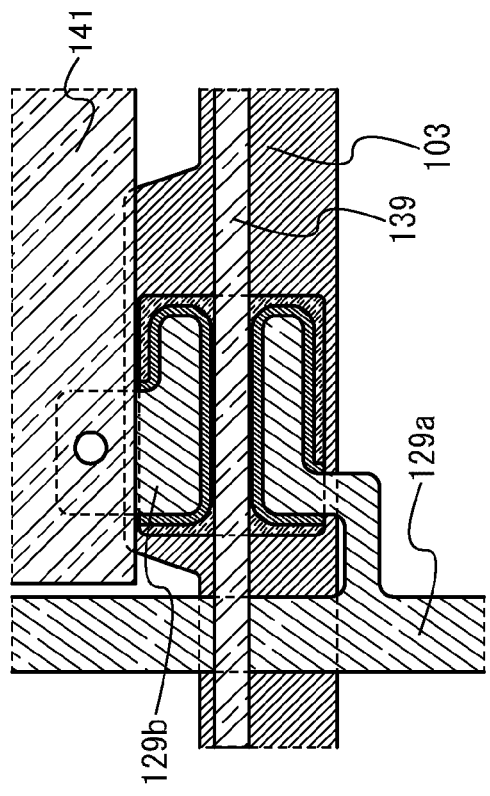

Further alternatively, as shown in FIG. 3C, the back gate electrode 139 is not necessarily connected to the gate electrode 103 and may be in a floating state. In that case, channel regions are formed on the gate insulating film 105 side and on the insulating film 137 side in the microcrystalline semiconductor region without applying potential to the back gate electrode 139; thus, the on-state current of the thin film transistor can be increased.

Figure 3D:
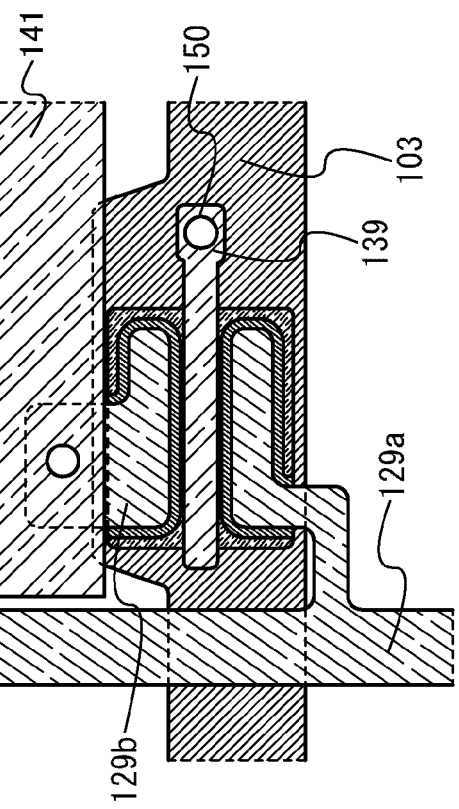

Further, as shown in FIG. 3D, the back gate electrode 139 may overlap with the wirings 129a and 129b with the insulating film 137 provided therebetween. Although FIG. 3D shows the case of using the back gate electrode 139 shown in FIG. 3A, the back gate electrode 139 of FIG. 3B or FIG. 3C may be made to overlap with the wirings 129a and 129b as well.

In the thin film transistor described in this embodiment, the amorphous semiconductor regions 134a and 134b are provided between the microcrystalline semiconductor region 135 and the impurity semiconductor regions 133a and 133b. Thus, the off-state current of the thin film transistor can be reduced. Further, since the back channel region is formed by the etching including the two stages, the residue on the surface of the back channel region can be reduced, and the off-state current of the thin film transistor can be reduced. Further, since the metal oxide film formed of a hardly-etched material is provided over the wirings as an etching protective film, a reduction in thickness of each of the wirings in the etching including the two stages can be reduced. Accordingly, a thin film transistor having low off-state current can be manufactured. Further, electrolytic corrosion of the wirings and the pixel electrode can be reduced, and contact resistance at the connection portion of the pixel electrode and the wirings can be reduced.

Embodiment 2

In this embodiment, a method for manufacturing a thin film transistor, by which the off-state current can be further reduced as compared to the case in Embodiment 1, will be described with reference to FIGS. 4A to 4C.

Figure 4A:
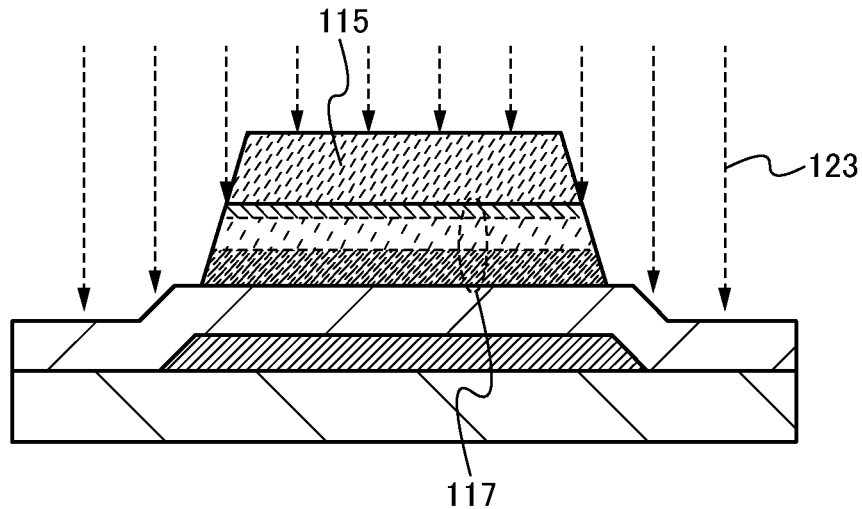
FIGS. 4A to 4C are cross-sectional views showing a method for manufacturing a semiconductor device according to one embodiment of the present invention.

As in Embodiment 1, the semiconductor film 117 is formed as shown in FIG. 4A during the step of FIG. 1A.

Next, plasma treatment is performed in which the side surface of the semiconductor film 117 is exposed to plasma 123 with a mask 115 left. Here, plasma is generated in an oxidizing gas atmosphere or a nitriding gas atmosphere, and the semiconductor film 117 is exposed to the plasma 123. Examples of the oxidizing gas include oxygen, ozone, dinitrogen monoxide, water vapor, a mixed gas of oxygen and hydrogen, and the like. Examples of the nitriding gas include nitrogen, ammonia, nitrogen fluoride, nitrogen chloride, chloroamine, fluoroamine, and the like. Plasma generation in the oxidizing gas atmosphere or the nitriding gas atmosphere causes a radical to be generated. The radical reacts with the semiconductor film 117, so that an insulating region 125 that is an oxide or nitride is formed on the side surface of the semiconductor film 117. Instead of the irradiation with plasma, irradiation with ultraviolet light may be employed to generate a radical.

Figure 4B:
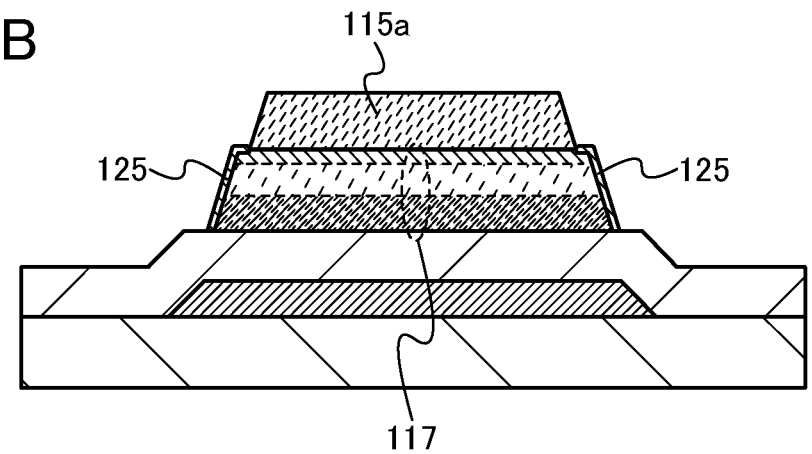

In the case of using oxygen, ozone, water vapor, or a mixed gas of oxygen and hydrogen as the oxidizing gas, the resist recedes by plasma irradiation, whereby a mask 115a whose top surface is reduced in area is formed as shown in FIG. 4B. Consequently, the side and the top surfaces of the semiconductor film 117 are partly oxidized by the plasma treatment, and the insulating region 125 that is an oxide or nitride is formed on the side and the top surfaces of the semiconductor film 117.

Figure 4C:
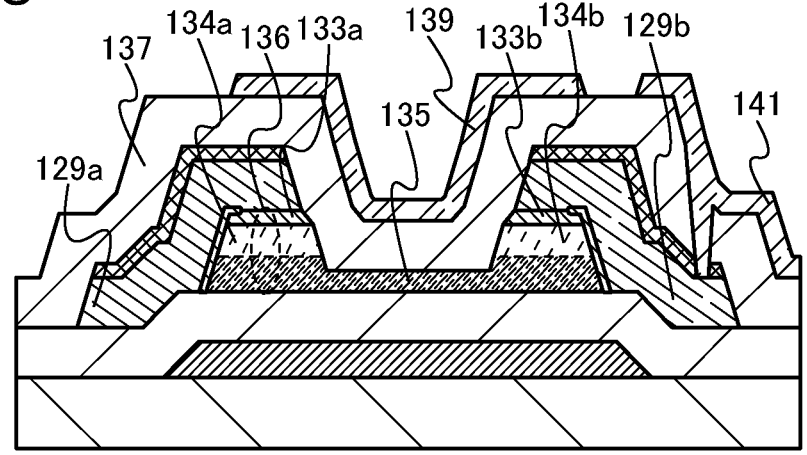

Next, as described in Embodiment 1, through the steps similar to those in FIGS. 1A and 1B and FIGS. 2A to 2C, the wirings 129a and 129b functioning as a source electrode and a drain electrode; the semiconductor film 136 including the microcrystalline semiconductor region 135, the pair of amorphous semiconductor regions 134a and 134b, and the pair of impurity semiconductor regions 133a and 133b; the insulating film 137; and the back gate electrode 139 are formed as shown in FIG. 4C. Accordingly, a dual-gate thin film transistor can be manufactured.

In the thin film transistor described in this embodiment, by the provision of the insulating region 125 that is an oxide or nitride between the semiconductor film 136 and each of the wirings 129a and 129b, holes injected from the wirings 129a and 129b to the semiconductor film 136 can be reduced. Thus, the thin film transistor can have much lower off-state current than the transistor described in Embodiment 1.

Embodiment 3

In this embodiment, a method for manufacturing a thin film transistor whose on-state current can be further increased as compared to the on-state current of the thin film transistor in Embodiment 1 while off-state current is reduced, will be described with reference to FIGS. 5A and 5B.

Figure 5A:
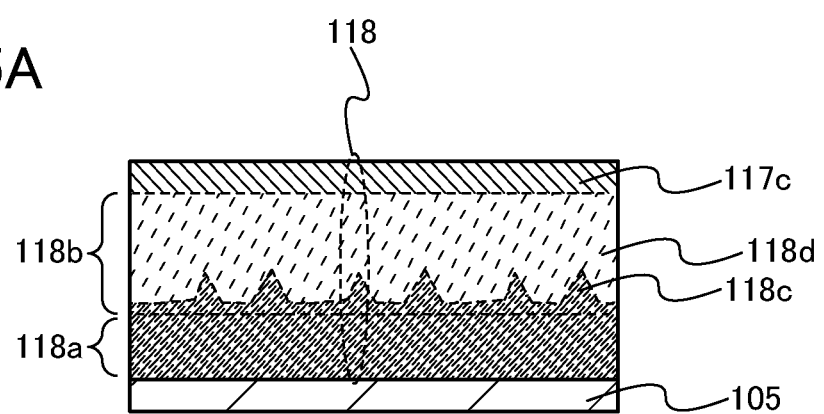
FIGS. 5A and 5B are cross-sectional views each showing a method for manufacturing a semiconductor device according to one embodiment of the present invention.
Figure 5B:
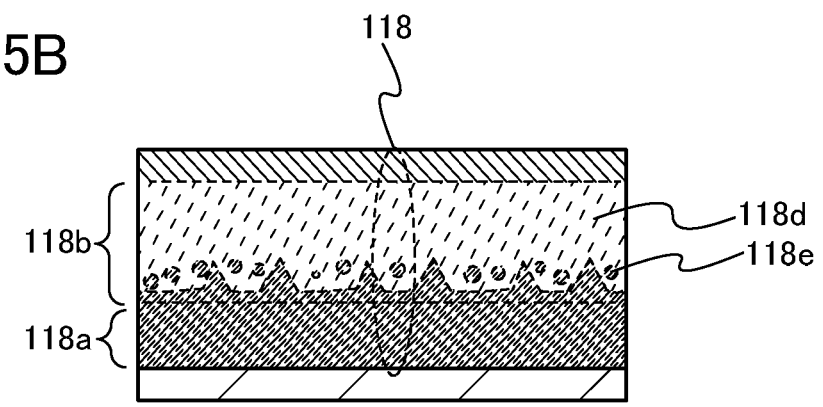

In this embodiment, a semiconductor film 118 as shown in FIGS. 5A and 5B is used instead of the semiconductor film 117 that is shown in FIG. 1A. Note that FIGS. 5A and 5B are each an enlarged view of a portion between the gate insulating film 105 and the impurity semiconductor region 117c.

The semiconductor film 118 includes a microcrystalline semiconductor film 118a, a semiconductor film 118b including a microcrystalline semiconductor region 118c and an amorphous semiconductor region 118d, and the impurity semiconductor region 117c. In the semiconductor film 118, the interface between the microcrystalline semiconductor region 118c and the amorphous semiconductor region 118d is uneven.

As shown in FIG. 5A, the interface between the microcrystalline semiconductor region 118c and the amorphous semiconductor region 118d is uneven, and a projection has a conical or pyramidal shape whose width decreases from the gate insulating film 105 side toward the impurity semiconductor region 117c (a tip of the projection has an acute angle). Note that the projection may have an inverted conical or pyramidal shape whose width increases from the gate insulating film 105 side toward the impurity semiconductor region 117c.

The microcrystalline semiconductor region 118c is uneven; thus, the on-state current of the thin film transistor can be increased.

Further, in order to improve the crystallinity of the microcrystalline semiconductor film 118a and the semiconductor film 118b, it is preferable that the concentrations of oxygen contained in the microcrystalline semiconductor film 118a and the microcrystalline semiconductor region 118c, which are measured by secondary ion mass spectrometry (SIMS), be less than $1 \times 10^{18}$ atoms/cm$^3$. The nitrogen concentration profile of the semiconductor film 118 which is measured by secondary ion mass spectrometry has a peak concentration greater than or equal to $1 \times 10^{20}$ atoms/cm$^3$ and less than or equal to $1 \times 10^{21}$ atoms/cm$^3$, preferably greater than or equal to $2 \times 10^{20}$ atoms/cm$^3$ and less than or equal to $1 \times 10^{21}$ atoms/cm$^3$ or less.

The amorphous semiconductor region 118d is formed using an amorphous semiconductor containing nitrogen. Nitrogen of the amorphous semiconductor containing nitrogen may exist, for example, as an NH group or an NH$_2$ group. As the amorphous semiconductor, amorphous silicon is used.

The amorphous semiconductor containing nitrogen is a semiconductor having a small amount of the defect absorption spectrum and low energy at an Urbach edge, measured by a constant photocurrent method (CPM) or photoluminescence spectroscopy, compared to a conventional amorphous semiconductor. That is, as compared to the conventional amorphous semiconductor, the amorphous semiconductor containing nitrogen is a well-ordered semiconductor which has few defects and whose tail of a level at a band edge in the valence band is steep. Since the amorphous semiconductor containing nitrogen has a steep tail of a level at a band edge in the valence band, the band gap is wide and tunneling current does not easily flow. Therefore, when the amorphous semiconductor containing nitrogen is provided between the microcrystalline semiconductor region 118c and the impurity semiconductor region 117c, the off-state current of the thin film transistor can be reduced. In addition, by the provision of the amorphous semiconductor containing nitrogen, the on-state current and the field-effect mobility can be increased.

Further, a peak of a spectrum of the amorphous semiconductor containing nitrogen obtained by low-temperature photoluminescence spectroscopy is greater than or equal to 1.31 eV and less than or equal to 1.39 eV. Note that a peak region of a spectrum obtained by performing low-temperature photoluminescence spectroscopy on a microcrystalline semiconductor, typically a microcrystalline silicon, is greater than or equal to 0.98 eV and less than or equal to 1.02 eV. Accordingly, the amorphous semiconductor including nitrogen is different from a microcrystalline semiconductor.

Further, like the amorphous semiconductor region 118d, the microcrystalline semiconductor region 118c may also contain an NH group or an $NH_2$ group.

Further, as shown in FIG. 5B, a semiconductor crystal grain 118e whose grain size is greater than or equal to 1 nm and less than or equal to 10 nm, preferably greater than or equal to 1 nm and less than or equal to 5 nm may be included in the amorphous semiconductor region 118d, so that the on-state current and the filed-effect mobility can be further increased.

A microcrystalline semiconductor having a projection (conical or pyramidal shape) whose width decreases from the gate insulating film 105 side toward the impurity semiconductor region 117c is formed in the following manner: crystals are grown using the microcrystalline semiconductor film 118a as a crystal nucleus under a condition where crystal growth is suppressed, and an amorphous semiconductor is deposited.

As a typical example of a method for forming the semiconductor film 118b, the semiconductor film 118b is formed in a process chamber of a plasma CVD apparatus by glow discharge plasma with the use of a mixture of a deposition gas containing silicon or germanium, hydrogen, and a gas containing nitrogen. Examples of the gas containing nitrogen include ammonia, nitrogen, nitrogen fluoride, nitrogen chloride, chloroamine, fluoroamine, and the like. Glow discharge plasma can be generated in a manner similar to that of the gate insulating film 105.

In this case, the flow ratio of hydrogen to the deposition gas containing silicon or germanium is similar to that for forming the microcrystalline semiconductor film to be the microcrystalline semiconductor region 117a, and a gas containing nitrogen is further used for the source gas, whereby crystal growth can be suppressed as compared to the deposition condition of the microcrystalline semiconductor film 118a. Specifically, since a gas containing nitrogen is included in the source gas, the crystal growth is partly suppressed at an early stage of the deposition of the semiconductor film 118; thus, a conical or pyramidal microcrystalline semiconductor region grows, and an amorphous semiconductor region is formed. Further, at a middle stage and a later stage of deposition, crystal growth in the conical or pyramidal microcrystalline semiconductor region stops and only the amorphous semiconductor region is formed. As a result, in the semiconductor film 118b, the microcrystalline semiconductor region 118c and the amorphous semiconductor region 118d which is formed using a well-ordered semiconductor layer having fewer defects and a steep tail of a level at a band edge in the valence band, can be formed.

In this embodiment, the semiconductor film 118b including the microcrystalline semiconductor region 118c and the amorphous semiconductor region 118d is formed using the source gas, in which a gas containing nitrogen is included, of the semiconductor film 118b. Alternatively, the semiconductor film 118b including the microcrystalline semiconductor region 118c and the amorphous semiconductor region 118d may be formed in the following manner: a surface of the microcrystalline semiconductor film 118a is exposed to a gas containing nitrogen so that nitrogen is adsorbed to the surface of the microcrystalline semiconductor film 118a; and then film deposition is performed using hydrogen and a deposition gas containing silicon or germanium as a source gas.

Further alternatively, as the semiconductor film 118b, after a first microcrystalline semiconductor region is formed under the deposition condition of the microcrystalline semiconductor region to be the microcrystalline semiconductor region 117a described in Embodiment 1, a second microcrystalline semiconductor region and the amorphous semiconductor region may be formed under the condition in which a gas in which nitrogen is further added to the source gas satisfying the flow ratio for the microcrystalline semiconductor film to be the microcrystalline semiconductor region 117a described in Embodiment 1. At that time, when the flow ratio of hydrogen to the deposition gas containing silicon or germanium in the first microcrystalline semiconductor region is made lower compared to the flow ratio of hydrogen to the deposition gas containing silicon or germanium in the microcrystalline semiconductor region 117a in the deposition condition of the first microcrystalline semiconductor region, the deposition rate can be increased.

Since the microcrystalline semiconductor region 118c of the semiconductor film 118b has the conical or pyramidal shape or the inverted conical or pyramidal shape, resistance in the vertical direction (film thickness direction) of when voltage is applied between the source and drain electrodes in an on state, i.e., resistance of the semiconductor film 118b can be reduced. Further, less tunneling current flows by the provision of the amorphous semiconductor containing nitrogen between the microcrystalline semiconductor film 118a and the impurity semiconductor region 117c because the amorphous semiconductor is a well-ordered semiconductor which has fewer defects and whose tail of a level at a band edge in the valence band is steep. Thus, in the thin film transistor described in this embodiment, the on-state current and the field-effect mobility can be increased and the off-state current can be reduced.

Embodiment 4

In this embodiment, a method for manufacturing a microcrystalline semiconductor film which have high crystallinity and in which mixed phase grains are densely included in the microcrystalline semiconductor region 117a described in Embodiment 1 or the microcrystalline semiconductor film 118a described in Embodiment 3, is described with reference to FIGS. 6A to 6H.

Figure 6A:
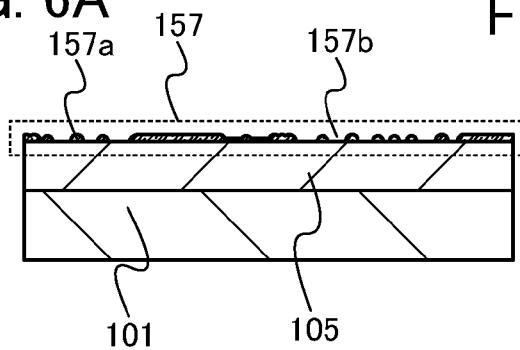
FIGS. 6A and 6H are cross-sectional views showing a method for manufacturing a semiconductor device according to one embodiment of the present invention.

As shown in FIG. 6A, the gate insulating film 105 is formed over the substrate 101, and a seed crystal 157 is formed over the gate insulating film 105.

The seed crystal 157 is formed using a microcrystalline semiconductor typified by microcrystalline silicon, microcrystalline silicon germanium, microcrystalline germanium, or the like. The seed crystal 157 may be in a state in which a plurality of mixed phase grains is dispersed, in a state in which mixed phase grains are continuously provided and form a film, or in a state in which mixed phase grains and an amorphous semiconductor region are continuously provided and form a film. Therefore, the seed crystal 157 may have a space 157b between adjacent mixed phase grains 157a without the mixed phase grains 157a being in contact with each other. Further, a feature of the seed crystal 157 is such that the density of the mixed phase grains (the existing proportion of the mixed phase grains in a plane) is low and the crystallinity of the mixed phase grains is high.

The seed crystal 157 is formed in a process chamber of a plasma CVD apparatus by glow discharge plasma with the use of a mixture of hydrogen and a deposition gas containing silicon or germanium as a source gas, under a first condition which enables mixed phase grains to be formed in the state that the density of the mixed phase grains is low and the crystallinity of the mixed phase grains is high. Alternatively, the seed crystal 157 is formed by glow discharge plasma with the use of a mixture of the source gas and a rare gas such as helium, argon, neon, krypton, or xenon. Here, the seed crystal 157 is formed under the first condition that the deposition gas is diluted so that the flow rate of hydrogen is 50 times or more and 1000 times or less that of the deposition gas containing silicon or germanium, and the pressure in the process chamber is higher than or equal to 67 Pa and lower than or equal to 13332 Pa (higher than or equal to 0.5 Torr and lower than or equal to 100 Torr). The flow rate of hydrogen is set higher than that of the deposition gas containing silicon or germanium as in the first condition, whereby crystal growth is promoted and the crystallinity of the mixed phase grains 157a in the seed crystal 157 is improved. That is, the size of a crystallite included in the mixed phase grain 157a in the seed crystal 157 is increased. Further, the space 157b is formed between the adjacent mixed phase grains 157a, which leads to a low grain density of the mixed phase grains 157a.

The glow discharge plasma for forming the seed crystal 157 is generated by application of high-frequency power which is cited in the formation of the gate insulating film 105 as appropriate. Further, as for the deposition temperature of the seed crystal 157, the deposition temperature which is cited in the formation of the microcrystalline semiconductor film to be the microcrystalline semiconductor region 117a is used as appropriate.

Figure 6E:
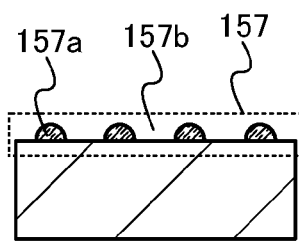
Figure 6B:
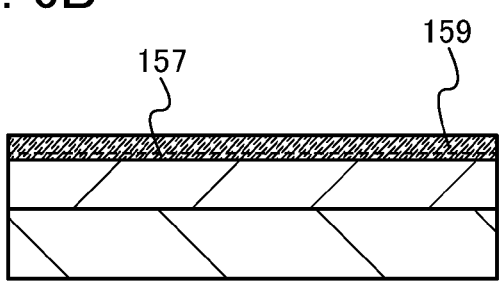

Next, as shown in FIG. 6B, a first microcrystalline semiconductor film 159 is formed on the seed crystal 157. The first microcrystalline semiconductor film 159 is formed under the condition where the space between the mixed phase grains 157a in the seed crystal 157 is filled and the crystal growth is promoted The first microcrystalline semiconductor film 159 is formed under a second condition in a process chamber of the plasma CVD apparatus by glow discharge plasma with the use of a mixture of hydrogen and a deposition gas containing silicon or germanium as a source gas. Alternatively, the first microcrystalline semiconductor film 159 is formed by glow discharge plasma with the use of a mixture of the source gas and a rare gas such as helium, argon, neon, krypton, or xenon. Here, the second condition is a condition that the deposition gas containing silicon or germanium is diluted so that the flow rate of hydrogen is 100 times or more and 6000 times or less (preferably 100 times of more and 3000 times or less) that of the deposition gas containing silicon or germanium, and the pressure inside the process chamber is higher than or equal to 1333 Pa and lower than or equal to 50000 Pa (higher than or equal to 10 Torr and lower than or equal to 370 Torr), preferably higher than or equal to 1333 Pa and lower than or equal to 13332 Pa (higher than or equal to 10 Torr and lower than or equal to 100 Torr).

As the first microcrystalline semiconductor film 159, a microcrystalline silicon film, a microcrystalline silicon germanium film, a microcrystalline germanium film, or the like is formed under the above second condition.

When the first microcrystalline semiconductor film 159 is formed, glow discharge plasma is generated by application of high-frequency power which is cited in the formation of the gate insulating film 105. In the case where the condition for generating glow discharge plasma in the formation of the seed crystal 157 and that in the formation of the first microcrystalline semiconductor film 159 are the same, throughput can be increased. However, the conditions may be different from each other. Further, as for the deposition temperature of the seed crystal 157, the deposition temperature which is cited in the formation of the microcrystalline semiconductor film to be the microcrystalline semiconductor region 117a is used as appropriate.

The first microcrystalline semiconductor film 159 is formed under the second condition where the space 157b between the mixed phase grains 157a in the seed crystal 157 is filled and the crystal growth is promoted. Because of such high pressure in the process chamber in the above-described second condition, the mean free path of the deposition gas is short and the energy of ions becomes lower, which lead to improvement of the coverage and reduction of ion damage, contributing to reduction of defects. Further, in the above condition, since the dilution ratio of the deposition gas containing silicon or germanium is high and the amount of generated hydrogen radicals is increased, the crystal grows using the crystallites in the mixed phase grains 157a as nuclei while the amorphous semiconductor region is etched. As a result, in the first microcrystalline semiconductor film 159, the ratio of the crystal regions to the amorphous semiconductor region is increased and the crystallinity is improved. Further, defects caused in the first microcrystalline semiconductor film 159 during the deposition are reduced.

Crystal growth of the first microcrystalline semiconductor film 159 occurs using the crystallites in the mixed phase grain 157a of the seed crystal 157 as nuclei. Further, the size of the mixed phase grain of the first microcrystalline semiconductor film 159 depends on the space between the mixed phase grains 157a of the seed crystal 157. Therefore, when the grain density of the mixed phase grains 157a of the seed crystal 157 is low, the space between the mixed phase grains 157a is large; thus, the crystal growth length of the mixed phase grain of the first microcrystalline semiconductor film 159 can be increased and the size of the mixed phase grain can be increased.

Figure 6F:
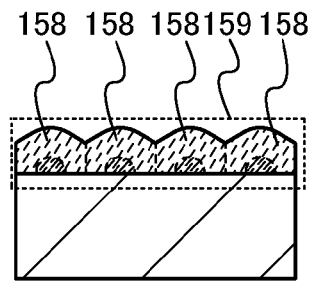
Figure 6C:
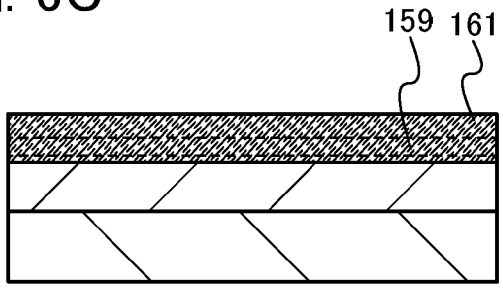

Next, as shown in FIG. 6C, a second microcrystalline semiconductor film 161 is formed over the first microcrystalline semiconductor film 159. The second microcrystalline semiconductor film 161 is formed under a condition that allows a microcrystalline semiconductor film having higher crystallinity than the first microcrystalline semiconductor film 159 to be formed without increasing the space between the mixed phase grains included in the first microcrystalline semiconductor film.

The second microcrystalline silicon film 161 is formed in a process chamber of the plasma CVD apparatus by glow discharge plasma with the use of a mixture of hydrogen and a deposition gas containing silicon or germanium as a source gas under a third condition. Alternatively, the second microcrystalline silicon film 161 may be formed by glow discharge plasma with the use of a mixture of the source gas and a rare gas such as helium, argon, neon, krypton, or xenon. Here, the third condition is a condition that the pressure in the process chamber is higher than or equal to 1333 Pa and lower than or equal to 50000 Pa, preferably higher than or equal to 1333 Pa and lower than or equal to 13332 Pa, and a first period in which a microcrystalline semiconductor is deposited and a second period that is longer than the first period, in which an amorphous semiconductor region included in the microcrystalline semiconductor is selectively etched, are performed alternately.

In order to alternately perform the first period for which a microcrystalline semiconductor is deposited and the second period that is longer than the first period, in which an amorphous semiconductor region included in the microcrystalline semiconductor is selectively etched, the flow ratio of the deposition gas containing silicon or germanium to hydrogen is alternately increased and decreased; specifically, the flow rate of the deposition gas containing silicon or germanium or the flow rate of hydrogen is increased and decreased. In the case where the flow ratio of hydrogen to the deposition gas containing silicon or germanium is low, typically, in the case where the flow rate of hydrogen is 100 times or more and 2000 times or less that of the deposition gas, deposition and crystal growth of the microcrystalline semiconductor is primarily caused. On the other hand, in the case where the flow ratio of hydrogen to the deposition gas containing silicon or germanium is high, typically, in the case where the flow rate of the deposition gas containing silicon or germanium is more than 0 sccm and 0.3 sccm or less and the flow rate of hydrogen is more than 1000 sccm, etching of the amorphous semiconductor region included in the microcrystalline semiconductor is primarily caused. Here, in the case where the flow rate of hydrogen is fixed and the flow rate of the deposition gas containing silicon or germanium is increased and decreased, the introduction of the same flow rate of hydrogen as that in the first period to the process chamber enables the pressure in the process chamber to be constant in the first period and the second period; accordingly, uniformity in the film quality of the second microcrystalline semiconductor film can be increased. In the case where the flow ratio of hydrogen to the deposition gas containing silicon or germanium is high, the amorphous semiconductor region is etched primarily rather than the crystallites in the microcrystalline semiconductor at a pressure in the process chamber of higher than or equal to 1333 Pa and lower than or equal to 50000 Pa, further preferably higher than or equal to 1333 Pa and lower than or equal to 13332 Pa.

By repeating the above-described first period and second period, exposure of the crystallites owing to the primary etching of the amorphous semiconductor region in the second period and the crystal growth in which the exposed crystallites are used as nuclei in the first period are alternately performed. Accordingly, the size of the crystallites in the mixed phase grains is increased, and further the crystal growth is caused to form crystals having an orientation plane. If the second period is longer than the first period, the amorphous semiconductor region in the microcrystalline semiconductor is sufficiently etched; thus, the amount of amorphous semiconductor included in the second microcrystalline semiconductor film can be reduced. As a result, the second microcrystalline semiconductor film having higher crystallinity than the first microcrystalline semiconductor film can be formed without increasing the space between the mixed phase grains in the first microcrystalline semiconductor film. Further, defects in the second microcrystalline semiconductor film 161 can be reduced.

In the second period, by setting the flow rate of the deposition gas containing silicon or germanium to a slight flow rate, typically to a flow rate of more than 0 sccm and less than or equal to 0.3 sccm, a slight amount of radicals (typically silyl radicals) generated from the deposition gas is bonded to dangling bonds of the crystallites that are exposed by etching of the amorphous semiconductor region; thus, high crystallinity can be obtained through crystal growth. That is, crystal growth occurs concurrently with the etching, whereby the crystallinity of the second microcrystalline semiconductor film 161 is increased.

As the second microcrystalline semiconductor film 161, a microcrystalline silicon film, a microcrystalline silicon germanium film, a microcrystalline germanium film, or the like is formed under the above third condition.

When the second microcrystalline semiconductor film 161 is formed, glow discharge plasma is generated by application of high-frequency power which is cited in the formation of the gate insulating film 105. In the case where the condition for generating glow discharge plasma in the formation of the seed crystal 157, that in the formation of the first microcrystalline semiconductor film 159, and that in the formation of the second microcrystalline semiconductor film 161 are the same, throughput can be increased. However, the conditions may be different from each other. Further, as for the deposition temperature of the second microcrystalline semiconductor film 161, the deposition temperature which is cited in the formation of the microcrystalline semiconductor film to be the microcrystalline semiconductor region 117a is used as appropriate.

Note that if the pressure in the process chamber is higher than or equal to 1333 Pa and lower than or equal to 50000 Pa (higher than or equal to 10 Torr and lower than or equal to 370 Torr), preferably higher than or equal to 1333 Pa and lower than or equal to 13332 Pa (higher than or equal to 10 Torr and lower than or equal to 100 Torr), the pressure in the second condition may be higher than that in the first condition, the pressure in the first condition may be higher than that in the second condition, or alternatively, the pressure in the first condition may be equal to that in the second condition.

Figure 6G:
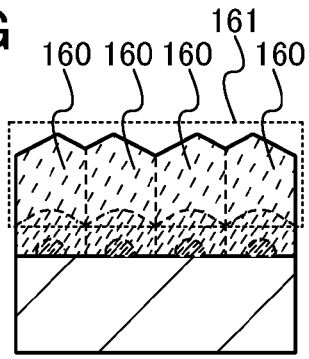
Figure 6D:
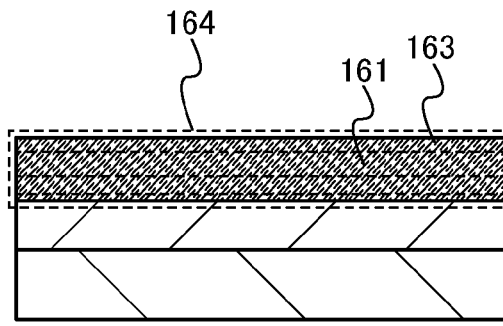

Next, as shown in FIG. 6D, a third microcrystalline semiconductor film 163 is formed over the second microcrystalline semiconductor film 161. The third microcrystalline semiconductor film 163 is formed under a condition which enables the third microcrystalline silicon film 163 to fill the space between the mixed phase grains of the second microcrystalline silicon film 161 and also promotes crystal growth.

The third microcrystalline semiconductor film 163 is formed in a process chamber of the plasma CVD apparatus by glow discharge plasma with the use of a mixture of hydrogen and a deposition gas containing silicon or germanium as a source gas under a fourth condition. Alternatively, the third microcrystalline semiconductor film 163 is formed by glow discharge plasma with the use of a mixture of the source gas and a rare gas such as helium, argon, neon, krypton, or xenon. Note that the fourth condition is the same as the second condition.

As the third microcrystalline semiconductor film 163, a microcrystalline silicon film, a microcrystalline silicon germanium film, a microcrystalline germanium film, or the like is formed under the above fourth condition.

When the fourth condition is the same as the second condition, the mean free path of the deposition gas is short because of high pressure in the process chamber; thus, the energy of ions becomes low and coverage is improved. Further, in the above condition, since the dilution ratio of the deposition gas containing silicon or germanium is high and the amount of generated hydrogen radicals is increased, the crystal grows using the crystallites in the second microcrystalline semiconductor film 161 as nuclei while the amorphous semiconductor region is etched. As a result, in the third microcrystalline semiconductor film 163, the ratio of the crystal regions to the amorphous semiconductor region is increased and the crystallinity is improved, which contributes to planarization of the third microcrystalline semiconductor film 163 during the deposition and the second microcrystalline semiconductor film 161.

Through the above steps, the microcrystalline semiconductor film 164 can be formed.

Here, conceptual diagrams showing film formation of the microcrystalline semiconductor film 164 described in this embodiment are shown in FIGS. 6E to 6H. FIGS. 6E to 6G are enlarged views illustrating the deposition state in FIGS. 6A to 6D.

As shown in FIG. 6E, the deposition step of the seed crystal 157 is a step for dispersing seed crystal grains in order to increase the size of the mixed phase grains included in the microcrystalline semiconductor film. Therefore, in the seed crystal 157, the mixed phase grains 157*a* that become the seed crystal grains are deposited with the space 157*b* provided therebetween as illustrated in FIG. 6E.

As shown in FIG. 6F, the deposition step of the first microcrystalline semiconductor film 159 is a step for causing crystal growth using the seed crystal grains as the nuclei and thereby forming a film including mixed phase grains with extremely little space provided therebetween. Thus, crystal growth is caused using the mixed phase grains 157*a* as the seed crystal grains, so that microcrystalline semiconductors 158 are deposited. Note that by the second condition, the microcrystalline semiconductors 158 grow not only in the film thickness direction but also in the plane direction. As a result, spaces between the microcrystalline semiconductors 158 are filled and the microcrystalline semiconductors 158 become in contact with each other.

As shown in FIG. 6G, the deposition step of the second microcrystalline semiconductor film 161 is a step for depositing microcrystalline semiconductors 160 having higher crystallinity over the microcrystalline semiconductors 158. In the deposition step of the second microcrystalline semiconductor film 161, the step for deposition and crystal growth of microcrystalline semiconductor and the step for primarily etching an amorphous semiconductor region included in the microcrystalline semiconductor and exposing crystallites included in the microcrystalline semiconductor are performed alternately. Further, since the pressure in the process chamber is higher than or equal to 1333 Pa and lower than or equal to 50000 Pa (higher than or equal to 10 Torr and lower than or equal to 370 Torr), preferably higher than or equal to 1333 Pa and lower than or equal to 13332 Pa (higher than or equal to 10 Torr and lower than or equal to 100 Torr), the amorphous semiconductor region in the microcrystalline semiconductor is primarily etched. For these reasons, epitaxial growth is likely to be caused at the time of deposition of the microcrystalline semiconductor on the exposed crystallites. Accordingly, in the deposition step of the second microcrystalline semiconductor film 161, orientation of the microcrystalline semiconductor becomes higher and the microcrystalline semiconductors 160 having an orientation plane are deposited.

Figure 6H:
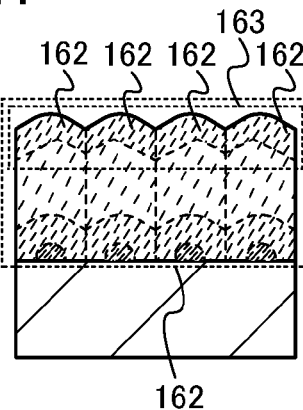

As shown in FIG. 6H, the deposition step of the third microcrystalline semiconductor film 163 is a step for causing crystal growth using the second microcrystalline semiconductor film 161 as the nucleus, reducing the unevenness of the second microcrystalline semiconductor film 161 while a space between the mixed phase grains in second microcrystalline semiconductor film 161 is filled, and thereby planarizing the surface of the second microcrystalline semiconductor film 161. Thus, crystal growth is caused using the microcrystalline semiconductors 160 as a seed crystal, so that a microcrystalline semiconductors 162 is deposited.

It is preferable that the pressure of the first condition be lower than that of the second condition because the seed crystal 157 can be uniformly distributed across the substrate plane in such a case. In addition, it is preferable that the flow ratio of hydrogen to the deposition gas containing silicon or germanium in the first condition be lower than that in the second condition because by the second condition, the depositing proportion of the seed crystal 157 increases as the density of the mixed phase grains is high, and because crystallinity and film density of the first microcrystalline semiconductor film 159 is improved.

Through the steps of FIGS. 6E to 6H, the microcrystalline semiconductor film 164 including mixed phase grains, which has high crystallinity, extremely little space between the mixed phase grains, and an orientation plane, can be formed. The mixed phase grains included in the microcrystalline semiconductor film 164 may be a microcrystalline semiconductor formed by deposition of the seed crystal 157, the first microcrystalline semiconductor film 159, the second microcrystalline semiconductor film 161, or the third microcrystalline semiconductor film 163. Alternatively, the mixed phase grains included in the microcrystalline semiconductor film 164 may be a microcrystalline semiconductor formed by deposition and crystal growth of two or more of the seed crystal 157, the first microcrystalline semiconductor film 159, the second microcrystalline semiconductor film 161 and the third microcrystalline semiconductor film 163.

Embodiment 5

A thin film transistor is manufactured, and a semiconductor device including a display function (also referred to as a display device) can be manufactured using the thin film transistor in a pixel portion and further in a driver circuit. Further, part or whole of a driver circuit can be formed over the same substrate as a pixel portion, using a thin film transistor, whereby a system-on-panel can be obtained.

The display device includes a display element. As the display element, a liquid crystal element (also referred to as a liquid crystal display element) or a light-emitting element (also referred to as a light-emitting display element) can be used. The light-emitting element includes, in its category, an element whose luminance is controlled by current or voltage, and specifically includes, in its category, an inorganic electroluminescent (EL) element, an organic EL element, and the like. Furthermore, a display medium whose contrast is changed by an electric effect, such as electronic ink, can be used.

In addition, the display device includes a panel in which the display element is sealed, and a module in which an IC or the like including a controller is mounted on the panel. Furthermore, an element substrate, which corresponds to one embodiment before the display element is completed in a manufacturing process of the display device, is provided with a means for supplying current to the display element in each of a plurality of pixels. Specifically, the element substrate may be in a state in which only a pixel electrode of the display element is provided, a state after a conductive film to be a pixel electrode is formed and before the pixel electrode is formed by etching the conductive film, or any other states.

Note that a display device in this specification means an image display device, a display device, or a light source (including a lighting device). Further, the display device also includes any of the following modules in its category: a module to which a connector such as a flexible printed circuit (FPC), a tape automated bonding (TAB) tape, or a tape carrier package (TCP) is attached; a module having a TAB tape or a TCP at the end of which a printed wiring board is provided; and a module having an integrated circuit (IC) that is directly mounted on a display element by a chip on glass (COG) method.

Embodiment 6

A semiconductor device disclosed in this specification can be applied to a variety of electronic devices (including game machines). Examples of the electronic devices include television sets (also referred to as televisions or television receivers), monitors of computers or the like, cameras such as digital cameras or digital video cameras, digital photo frames, cellular phones (also referred to as mobile phones or cellular phone sets), portable game consoles, portable information terminals, audio reproducing devices, large-sized game machines such as pachinko machines, electronic paper, and the like. An electronic paper can be used for electronic devices of a variety of fields as long as they can display data. For example, electronic paper can be applied to an electronic book reader (e-book), a poster, a digital signage, a public information display (PID), an advertisement in a vehicle such as a train, displays of various cards such as a credit card, and the like. An example of the electronic device is illustrated in FIG. 7.

FIG. 7 illustrates an example of the electronic book reader. For example, an electronic book reader 2700 includes two housings, a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can operate like a paper book.

A display portion 2705 and a photoelectric conversion device 2706 are incorporated in the housing 2701. A display portion 2707 and a photoelectric conversion device 2708 are incorporated in the housing 2703. The display portion 2705 and the display portion 2707 may display one image or different images. In the case where the display portion 2705 and the display portion 2707 display different images, for example, text can be displayed on a display portion on the right side (the display portion 2705 in FIG. 7) and graphics can be displayed on a display portion on the left side (the display portion 2707 in FIG. 7).

FIG. 7 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like may also be provided on the surface of the housing, on which the display portion is provided. Furthermore, an external connection terminal (an earphone terminal, a USB terminal, a terminal connectable to an AC adapter or a variety of cables such as a USB cable, or the like), a recording medium insertion portion, and the like may be provided on the back surface or the side surface of the housing. Moreover, the electronic book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

This application is based on Japanese Patent Application serial no. 2011-108761 filed with Japan Patent Office on May 13, 2011, the entire contents of which are hereby incorporated by reference.

What is claimed is:

1. A method for manufacturing a semiconductor device comprising:
    forming a gate insulating film over a gate electrode;
    forming a semiconductor film comprising a microcrystalline semiconductor region and an amorphous semiconductor region over the gate insulating film;
    performing a plasma treatment to form an insulating region on a side surface and part of a top surface of the semiconductor film;
    forming a conductive film over the semiconductor film and the insulating region;
    forming an etching protective film comprising an aluminum oxide over the conductive film;
    forming a mask over the etching protective film;
    performing a first etching treatment in which the etching protective film, the conductive film, and the amorphous semiconductor region are partly etched so that the amorphous semiconductor region is exposed and wirings functioning as a source electrode and a drain electrode are formed;
    removing the mask; and
    after removing the mask, performing a second etching treatment in which the exposed amorphous semiconductor region and the microcrystalline semiconductor region are partly dry-etched so that the microcrystalline semiconductor region is partly exposed,
    wherein fluorine or a fluoride is used as an etching gas in the second etching treatment.

2. The method for manufacturing a semiconductor device according to claim 1, wherein the etching protective film is formed using silicate including the aluminum oxide.

3. The method for manufacturing a semiconductor device according to claim 1, wherein the etching protective film is formed using a composite oxide further containing one or more of a zirconium oxide and a hafnium oxide.

4. The method for manufacturing a semiconductor device according to claim 1, wherein a region including a surface of the conductive film is formed using titanium, a titanium compound, or a titanium alloy.

5. The method for manufacturing a semiconductor device according to claim 1, wherein the first etching treatment is performed under a condition in which the etching protective film and the conductive film are etched.

6. The method for manufacturing a semiconductor device according to claim 1, wherein the first etching treatment is performed under a condition in which chlorine and or a chloride is used.

7. The method for manufacturing a semiconductor device according to claim 1, wherein the second etching treatment is performed under a condition in which the exposed amorphous semiconductor region and the microcrystalline semiconductor region are more selectively etched than the etching protective film.

8. The method for manufacturing a semiconductor device according to claim 1, wherein the semiconductor film includes the microcrystalline semiconductor region, the amorphous semiconductor region, and an impurity semiconductor region which are stacked.

9. A method for manufacturing a semiconductor device comprising:
    forming a gate insulating film over a gate electrode;
    forming a semiconductor film comprising a microcrystalline semiconductor region and an amorphous semiconductor region over the gate insulating film, the amorphous semiconductor region being formed over the microcrystalline semiconductor region;
    performing a plasma treatment to form an insulating region on a side surface and part of a top surface of the semiconductor film;
    forming a conductive film over the semiconductor film and the insulating region;
    forming an etching protective film comprising an aluminum oxide over the conductive film;
    forming a mask over the etching protective film;
    performing a first etching treatment in which the etching protective film, the conductive film, and the amorphous semiconductor region are partly etched so that the amorphous semiconductor region is exposed and wirings functioning as a source electrode and a drain electrode are formed;

removing the mask;

after removing the mask, performing a second etching treatment in which the exposed amorphous semiconductor region and the microcrystalline semiconductor region are partly dry-etched so that the microcrystalline semiconductor region is partly exposed;

forming an insulating film over the etched microcrystalline semiconductor region, the etched amorphous semiconductor region, and the etched etching protective film; and forming a back gate electrode and a pixel electrode connected to the wirings functioning as the source electrode and the drain electrode over the insulating film, wherein the back gate electrode overlaps with the etched microcrystalline semiconductor region, and wherein fluorine or a fluoride is used as an etching gas in the second etching treatment.

10. The method for manufacturing a semiconductor device according to claim 9, wherein the gate electrode is parallel to the back gate electrode.

11. The method for manufacturing a semiconductor device according to claim 9, wherein the gate electrode and the back gate electrode are connected to each other.

12. The method for manufacturing a semiconductor device according to claim 9, wherein the back gate electrode is in a floating state.

13. The method for manufacturing a semiconductor device according to claim 9, wherein the back gate electrode and the pixel electrode are formed at the same time.

14. The method for manufacturing a semiconductor device according to claim 9, wherein the etching protective film is formed using silicate including the aluminum oxide.

15. The method for manufacturing a semiconductor device according to claim 9, wherein the etching protective film is formed using a composite oxide further containing one or more of a zirconium oxide and a hafnium oxide.

16. The method for manufacturing a semiconductor device according to claim 9, wherein a region including a surface of the conductive film is formed using titanium, a titanium compound, or a titanium alloy.

17. The method for manufacturing a semiconductor device according to claim 9, wherein the first etching treatment is performed under a condition in which the etching protective film and the conductive film are etched.

18. The method for manufacturing a semiconductor device according to claim 9, wherein the first etching treatment is performed under a condition in which chlorine and or a chloride is used.

19. The method for manufacturing a semiconductor device according to claim 9, wherein the second etching treatment is performed under a condition in which the exposed amorphous semiconductor region and the microcrystalline semiconductor region are more selectively etched than the etching protective film.

20. The method for manufacturing a semiconductor device according to claim 9, wherein the semiconductor film includes the microcrystalline semiconductor region, the amorphous semiconductor region, and an impurity semiconductor region which are stacked.

21. A method for manufacturing a semiconductor device comprising:

forming a gate insulating film over a gate electrode;

forming a semiconductor film comprising a microcrystalline semiconductor region and an amorphous semiconductor region over the gate insulating film;

performing a plasma treatment to form an insulating region on a side surface and part of a top surface of the semiconductor film;

forming a conductive film over the semiconductor film and the insulating region;

forming an etching protective film comprising an aluminum oxide over the conductive film;

forming a mask over the etching protective film;

etching the etching protective film, the conductive film, and the amorphous semiconductor region by a first dry etching with the mask to expose a part of the amorphous semiconductor region and to form a source electrode and a drain electrode;

removing the mask; and after removing the mask, etching the exposed amorphous semiconductor region and the microcrystalline semiconductor region by a second dry etching to expose a part of the microcrystalline semiconductor region, wherein fluorine or a fluoride is used as an etching gas in the second dry etching.

22. The method for manufacturing a semiconductor device according to claim 21, wherein the etching protective film is formed using silicate including the aluminum oxide.

23. The method for manufacturing a semiconductor device according to claim 21, wherein the etching protective film is formed using a composite oxide further containing one or more of a zirconium oxide and a hafnium oxide.

24. The method for manufacturing a semiconductor device according to claim 21, wherein a region including a surface of the conductive film is formed using titanium, a titanium compound, or a titanium alloy.

25. The method for manufacturing a semiconductor device according to claim 21, wherein the first dry etching is performed under a condition in which the etching protective film and the conductive film are etched.

26. The method for manufacturing a semiconductor device according to claim 21, wherein the first dry etching is performed under a condition in which chlorine and or a chloride is used.

27. The method for manufacturing a semiconductor device according to claim 21, wherein the second dry etching is performed under a condition in which the exposed amorphous semiconductor region and the microcrystalline semiconductor region are more selectively etched than the etching protective film.

28. The method for manufacturing a semiconductor device according to claim 21, wherein the semiconductor film includes the microcrystalline semiconductor region, the amorphous semiconductor region, and an impurity semiconductor region which are stacked.

29. A method for manufacturing a semiconductor device comprising:

forming a gate insulating film over a gate electrode;

forming a semiconductor film over the gate insulating film;

performing a plasma treatment to form an insulating region on a side surface and part of a top surface of the semiconductor film;

forming a conductive film over the semiconductor film and the insulating region;

forming an etching protective film comprising an aluminum oxide over the conductive film;

forming a mask over the etching protective film;

performing a first etching treatment on the etching protective film, the conductive film, and the semiconductor film, thereby exposing a first portion of the semiconductor film and forming a source electrode and a drain electrode from the conductive film;

removing the mask;

after removing the mask, performing a second etching treatment on the first portion of the semiconductor film, thereby exposing a second portion of the semiconductor film comprising a channel region;

forming an insulating film over the second portion of the semiconductor film and the etching protective film; and forming a back gate electrode over the insulating film, wherein fluorine or a fluoride is used as an etching gas in the second etching treatment.

* * * * *